(12) United States Patent
Koyama et al.

(10) Patent No.: US 11,089,680 B2
(45) Date of Patent: Aug. 10, 2021

(54) MULTILAYER SUBSTRATE, INTERPOSER, AND ELECTRONIC DEVICE

(71) Applicant: Murata Manufacturing Co., Ltd., Nagaokakyo (JP)

(72) Inventors: Hiromasa Koyama, Nagaokakyo (JP); Ryosuke Takada, Nagaokakyo (JP); Atsushi Kasuya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/850,174

(22) Filed: Apr. 16, 2020

(65) Prior Publication Data

US 2020/0245460 A1 Jul. 30, 2020

Related U.S. Application Data

(63) Continuation of application No. PCT/JP2018/038278, filed on Oct. 15, 2018.

(30) Foreign Application Priority Data

Oct. 26, 2017 (JP) .............................. JP2017-206733

(51) Int. Cl.
*H05K 1/11* (2006.01)
*H05K 1/02* (2006.01)
(Continued)

(52) U.S. Cl.
CPC ........... *H05K 1/113* (2013.01); *H05K 1/0216* (2013.01); *H05K 1/181* (2013.01); *H05K 3/4644* (2013.01);
(Continued)

(58) Field of Classification Search
CPC ................. H05K 1/0216; H05K 1/113; H05K 2201/10522; H05K 1/181; H05K 2201/10378
(Continued)

(56) References Cited

U.S. PATENT DOCUMENTS 5,456,778 A * 10/1995 Fukuta .................. H01L 21/486
156/89.17
6,399,891 B1 6/2002 Kurita et al.
(Continued)

FOREIGN PATENT DOCUMENTS

JP 08-236979 A 9/1996
JP 2001-015929 A 1/2001
(Continued)

OTHER PUBLICATIONS

Official Communication issued in International Patent Application No. PCT/JP2018/038278, dated Jan. 8, 2019.

*Primary Examiner* — Sherman Ng
(74) *Attorney, Agent, or Firm* — Keating & Bennett, LLP

(57) ABSTRACT

A multilayer substrate includes a base body including a first main surface, a first external electrode provided on the first main surface and made of metal foil, a first interlayer connection conductor, and a second interlayer connection conductor having higher conductivity than the first interlayer connection conductor. The base body includes insulating base material layers that are stacked on one another. The first interlayer connection conductor is provided at least in an insulating base material layer on which the first external electrode is provided, and is connected to the first external electrode. The second interlayer connection conductor is disposed inside the base body, and is connected to the first external electrode through the first interlayer connection conductor.

21 Claims, 6 Drawing Sheets

(51) Int. Cl.
*H05K 1/18* (2006.01)
*H05K 3/46* (2006.01)

(52) U.S. Cl.
CPC .............. *H05K 2201/10522* (2013.01); *H05K 2201/10734* (2013.01)

(58) Field of Classification Search
USPC ........................................................ 174/262
See application file for complete search history.

(56) References Cited

U.S. PATENT DOCUMENTS

| | | | |
|---|---|---|---|
| 7,652,213 B2 * | 1/2010 | Yamamoto ............. | H05K 1/113 174/262 |
| 2002/0076903 A1 | 6/2002 | Kondo et al. | |
| 2008/0093117 A1 * | 4/2008 | Oikawa ............. | H01L 23/49822 174/262 |
| 2012/0205145 A1 * | 8/2012 | Sakai ................... | H05K 3/4632 174/255 |
| 2016/0066428 A1 * | 3/2016 | Tago .................... | H05K 1/0298 361/764 |

FOREIGN PATENT DOCUMENTS

| | | |
|---|---|---|
| JP | 2003-086948 A | 3/2003 |
| JP | 2007-088356 A | 4/2007 |
| JP | 2014-067788 A | 4/2014 |
| JP | 2014-146650 A | 8/2014 |

\* cited by examiner

MULTILAYER SUBSTRATE, INTERPOSER, AND ELECTRONIC DEVICE

CROSS REFERENCE TO RELATED APPLICATIONS

This application claims the benefit of priority to Japanese Patent Application No. 2017-206733 filed on Oct. 26, 2017 and is a Continuation Application of PCT Application No. PCT/JP2018/038278 filed on Oct. 15, 2018. The entire contents of each application are hereby incorporated herein by reference.

BACKGROUND OF THE INVENTION

1. Field of the Invention

The present invention relates to a multilayer substrate in which a base body including a plurality of insulating base material layers that are stacked on one another includes an interlayer connection conductor, an interposer, and an electronic device including such an interposer.

2. Description of the Related Art

Conventionally, a multilayer substrate obtained by stacking a plurality of insulating base material layers each including a conductor pattern made of copper foil or the like on a surface thereof has been known.

For example, Japanese Unexamined Patent Application Publication No. 2003-086948 discloses a multilayer substrate including an interlayer connection conductor provided by filling conductive paste in an opening provided in each of the insulating base material layers and then firing the conductive paste. The interlayer connection conductor of the multilayer substrate functions as a bonding material to bond conductors provided on each insulating base material layer in a stacking direction in which a plurality of insulating base material layers are stacked.

However, in the multilayer substrate disclosed in Japanese Unexamined Patent Application Publication No. 2003-086948, a material that achieves a function as a bonding material is selected as a material of an interlayer connection conductor, so that a selectable material is limited. In addition, the material that achieves a function as a bonding material has higher conductor resistance than a simple metal substance in many cases, so that the conductor resistance of the interlayer connection conductor after firing tends to be high.

SUMMARY OF THE INVENTION

Preferred embodiments of the present invention provide multilayer substrates each including an interlayer connection conductor capable of reducing conductor resistance while maintaining bondability with an external electrode provided on a surface of a base body, interposers, and electronic devices each including an interposer.

A multilayer substrate according to a preferred embodiment of the present invention includes a base body including a plurality of insulating base material layers that are stacked on one another, and a first main surface perpendicular or substantially perpendicular to a stacking direction in which the plurality of insulating base material layers are stacked, a first external electrode provided on the first main surface and made of metal foil, a first interlayer connection conductor connected to the first external electrode and disposed in the base body so as to penetrate one or more of the plurality of insulating base material layers, a second interlayer connection conductor disposed in the base body so as to penetrate one or more of the plurality of insulating base material layers, and a third interlayer connection conductor disposed in the base body so as to penetrate one or more of the plurality of insulating base material layers, and the second interlayer connection conductor includes a first end and a second end in the stacking direction, the first end of the second interlayer connection conductor is directly connected to the first interlayer connection conductor, the second end of the second interlayer connection conductor is directly connected to the third interlayer connection conductor, and the second interlayer connection conductor has higher conductivity than the first interlayer connection conductor and the third interlayer connection conductor.

The first interlayer connection conductor is a via conductor provided, for example, by filling conductive paste in a through hole provided in an insulating base material layer, and solidifying the conductive paste by a heating and pressing process. The conductive paste is made of a material of which the bondability with a conductor pattern or the like is emphasized, so that the conductivity of a via conductor or the like is not very high in many cases. On the other hand, according to this configuration, the first interlayer connection conductor (a via conductor, for example) and the second interlayer connection conductor (a metal element) are used in combination, and provide wiring extending in the stacking direction of the plurality of insulating base material layers, and connected to the first external electrode. Therefore, as compared with a case in which the wiring is provided only by a plurality of via conductors, conductor loss is able to be reduced.

According to this configuration, boundary surfaces of the first interlayer connection conductor and the first external electrode are connected by solid state diffusion bonding, and boundary surfaces of the first interlayer connection conductor and the second interlayer connection conductor are connected by solid state diffusion bonding. Therefore, as compared with a case in which the first interlayer connection conductor to be connected to the first external electrode is provided by a plating method or a similar method, bonding strength between the first external electrode and the first interlayer connection conductor and bonding strength between the first interlayer connection conductor and the second interlayer connection conductor are able to be increased with a simple manufacturing method.

In a multilayer substrate according to a preferred embodiment of the present invention, the first interlayer connection conductor may be provided at least in an insulating base material layer on which the first external electrode is provided, among the plurality of insulating base material layers.

In a multilayer substrate according to a preferred embodiment of the present invention, the first interlayer connection conductor may preferably be provided only in an insulating base material layer on which the first external electrode is provided. According to this configuration, as compared with a case in which the first interlayer connection conductor is configured such that a plurality of via conductors are connected to each other, the conductor loss of the wiring extending in the stacking direction is able to be reduced, and reliability of electrical connection of the wiring extending in the stacking direction is able to be increased.

In a multilayer substrate according to a preferred embodiment of the present invention, the base body includes a second main surface that faces the first main surface, the multilayer substrate may further include a second external electrode provided on the second main surface and made of metal foil, and the third interlayer connection conductor may be provided at least in an insulating base material layer on which the second external electrode is provided, among the plurality of insulating base material layers, and connected to the second external electrode. The via conductor or the like obtained by solidifying conductive paste does not have very high conductivity in many cases. On the other hand, according to this configuration, the third interlayer connection conductor (a via conductor, for example) and the second interlayer connection conductor (a metal element) are provided in combination, and provide wiring extending in the stacking direction of the plurality of insulating base material layers, and connected to the second external electrode. Therefore, as compared with a case in which the wiring is provided only by a plurality of via conductors, the conductor loss is able to be reduced.

In a multilayer substrate according to a preferred embodiment of the present invention, the third interlayer connection conductor may preferably be provided only in an insulating base material layer on which the second external electrode is provided. According to this configuration, as compared with a case in which the third interlayer connection conductor is configured such that a plurality of via conductors are connected to each other, the conductor loss of the wiring extending in the stacking direction is able to be reduced, and the reliability of electrical connection of the wiring extending in the stacking direction is able to be increased.

In a multilayer substrate according to a preferred embodiment of the present invention, a length of the base body in the stacking direction may preferably be larger than a length in a direction perpendicular or substantially perpendicular to the stacking direction. In a case in which the length of the base body in the stacking direction is large and the wiring extending in the stacking direction and connected to an external electrode is long, when the wiring is provided only by a plurality of via conductors, the conductor loss of the wiring is increased. Therefore, in particular, in the case in which the length of the base body in the stacking direction is large and the wiring is long, reduction of the conductor loss by providing the first interlayer connection conductor and the second interlayer connection conductor in combination is increased.

In a multilayer substrate according to a preferred embodiment of the present invention, the base body may include an end surface perpendicular or substantially perpendicular to the first main surface, and a planar conductor provided on the end surface. According to this configuration, due to a shielding effect of the planar conductor, unnecessary radiation from the second interlayer connection conductor or the like to outside is able to be significantly reduced or prevented, and/or the effect of noise from the outside on the second interlayer connection conductor or the like is able to be significantly reduced or prevented.

In a multilayer substrate according to a preferred embodiment of the present invention, the second interlayer connection conductor may preferably be disposed in two or more insulating base material layers among the plurality of insulating base material layers. According to this configuration, the number of via conductors required to provide the wiring extending in the stacking direction and connected to an external electrode is able to be reduced, so that a process of manufacturing a multilayer substrate is able to be simplified. In addition, with this configuration, the reliability of electrical connection of the wiring is increased.

In a multilayer substrate according to a preferred embodiment of the present invention, a length of the second interlayer connection conductor in the stacking direction may preferably be larger than a length of an interlayer connection conductor in the stacking direction, the interlayer connection conductor being electrically connected to the second interlayer connection conductor. According to this configuration, as compared with a case in which the length of the second interlayer connection conductor in the stacking direction is smaller the length of the via conductor or the like in the stacking direction, the conductor loss is able to be reduced.

In a multilayer substrate according to a preferred embodiment of the present invention, the multilayer substrate may preferably include a signal line defining at least a portion of a high-frequency transmission line, and the signal line may preferably include the first interlayer connection conductor and the second interlayer connection conductor. According to this configuration, as compared with a signal line that does not include the second interlayer connection conductor, the conductor resistance of the entire signal line is reduced and transmission loss is able to be reduced.

In a multilayer substrate according to a preferred embodiment of the present invention, at least one of the plurality of insulating base material layers may include the first interlayer connection conductor and the second interlayer connection conductor, or the third interlayer connection conductor and the second interlayer connection conductor.

An interposer according to a preferred embodiment of the present invention is disposed between a first element and a second element and electrically connects the first element and the second element, and the interposer includes a base body including a plurality of insulating base material layers that are stacked on one another, and including a first main surface and a second main surface that are perpendicular or substantially perpendicular to a stacking direction of the plurality of insulating base material layers are stacked, the first main surface and the second main surface facing each other, a first external electrode provided on the first main surface and made of metal foil, a second external electrode provided on the second main surface and made of metal foil, a first interlayer connection conductor connected to the first external electrode and disposed in the base body so as to penetrate one or more of the plurality of insulating base material layers, a second interlayer connection conductor disposed in the base body so as to penetrate one or more of the plurality of insulating base material layers, and a third interlayer connection conductor connected to the second external electrode and disposed in the base body so as to penetrate one or more of the plurality of insulating base material layers, and the second interlayer connection conductor includes a first end and a second end in the stacking direction, the first end of the second interlayer connection conductor is directly connected to the first interlayer connection conductor, the second end of the second interlayer connection conductor is directly connected to the third interlayer connection conductor, and the second interlayer connection conductor has higher conductivity than the first interlayer connection conductor and the third interlayer connection conductor.

According to this configuration, an interposer including an interlayer connection conductor capable of reducing conductor resistance while maintaining bondability with an external electrode provided on a surface of a base body is able to be obtained.

In an interposer according to a preferred embodiment of the present invention, the first interlayer connection conductor may be provided at least in an insulating base material layer on which the first external electrode is provided, among the plurality of insulating base material layers, and the third interlayer connection conductor may be provided at least in an insulating base material layer on which the second external electrode is provided, among the plurality of insulating base material layers.

In an interposer according to a preferred embodiment of the present invention, wiring between the first external electrode and the second external electrode may preferably be provided only by the first interlayer connection conductor, the second interlayer connection conductor, and the third interlayer connection conductor. According to this configuration, the wiring between the first external electrode and the second external electrode does not include other via conductors other than the first interlayer connection conductor and the third interlayer connection conductor, so that, as compared with a case in which the wiring includes other via conductors, the conductor loss is able to be further reduced.

In an interposer according to a preferred embodiment of the present invention, the base body may preferably include an end surface perpendicular or substantially perpendicular to the first main surface, and the interposer may further preferably include a planar conductor provided on the end surface. According to this configuration, due to a shielding effect of the planar conductor, unnecessary radiation from the second interlayer connection conductor or the like (a signal line) to outside is able to be significantly reduced or prevented, and/or the effect of noise from the outside on the second interlayer connection conductor (a signal line) is able to be significantly reduced or prevented.

In an interposer according to a preferred embodiment of the present invention, at least one of the plurality of insulating base material layers may include the first interlayer connection conductor and the second interlayer connection conductor, or the third interlayer connection conductor and the second interlayer connection conductor.

An electronic device according to a preferred embodiment of the present invention includes a first element, a second element, and an interposer disposed between the first element and the second element and electrically connecting the first element and the second element, the interposer includes a base body including a plurality of insulating base material layers that are stacked on one another, and including a first main surface and a second main surface that are perpendicular or substantially perpendicular to a stacking direction of the plurality of insulating base material layers are stacked, the first main surface and the second main surface facing each other, a first external electrode provided on the first main surface and made of metal foil, a second external electrode provided on the second main surface and made of metal foil, a first interlayer connection conductor connected to the first external electrode and disposed in the base body so as to penetrate one or more of the plurality of insulating base material layers, a second interlayer connection conductor disposed in the base body so as to penetrate one or more of the plurality of insulating base material layers, and a third interlayer connection conductor connected to the second external electrode and disposed in the base body so as to penetrate one or more of the plurality of insulating base material layers, and the second interlayer connection conductor includes a first end and a second end in the stacking direction, the first end of the second interlayer connection conductor is directly connected to the first interlayer connection conductor, the second end of the second interlayer connection conductor is directly connected to the third interlayer connection conductor, and the second interlayer connection conductor has higher conductivity than the first interlayer connection conductor and the third interlayer connection conductor.

According to this configuration, an electronic device including an interposer that includes an interlayer connection conductor capable of reducing conductor resistance while maintaining bondability with an external electrode provided on a surface of a base body is able to be obtained.

In an electronic device according to a preferred embodiment of the present invention, the first interlayer connection conductor may be provided at least in an insulating base material layer on which the first external electrode is provided, among the plurality of insulating base material layers, and the third interlayer connection conductor may be provided at least in an insulating base material layer on which the second external electrode is provided, among the plurality of insulating base material layers.

In an electronic device according to a preferred embodiment of the present invention, the electronic device may further include a component mounted on the first element or the second element and disposed between the first element and the second element.

In an electronic device according to a preferred embodiment of the present invention, the base body may preferably include an end surface perpendicular or substantially perpendicular to the first main surface, the interposer may preferably include a planar conductor provided on the end surface, and the planar conductor may preferably be positioned between the second interlayer connection conductor and the component. According to this configuration, due to a shielding effect of the planar conductor, unnecessary radiation from the second interlayer connection conductor (a signal line) to the component is able to be significantly reduced or prevented, and/or the effect of noise from the component on the signal line is able to be significantly reduced or prevented.

In an electronic device according to a preferred embodiment of the present invention, at least one of the plurality of insulating base material layers may include the first interlayer connection conductor and the second interlayer connection conductor, or the third interlayer connection conductor and the second interlayer connection conductor.

According to various preferred embodiments of the present invention, multilayer substrates each including an interlayer connection conductor capable of reducing conductor resistance while maintaining bondability with an external electrode provided on a surface of a base body, interposers, and electronic devices each including an interposer, are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
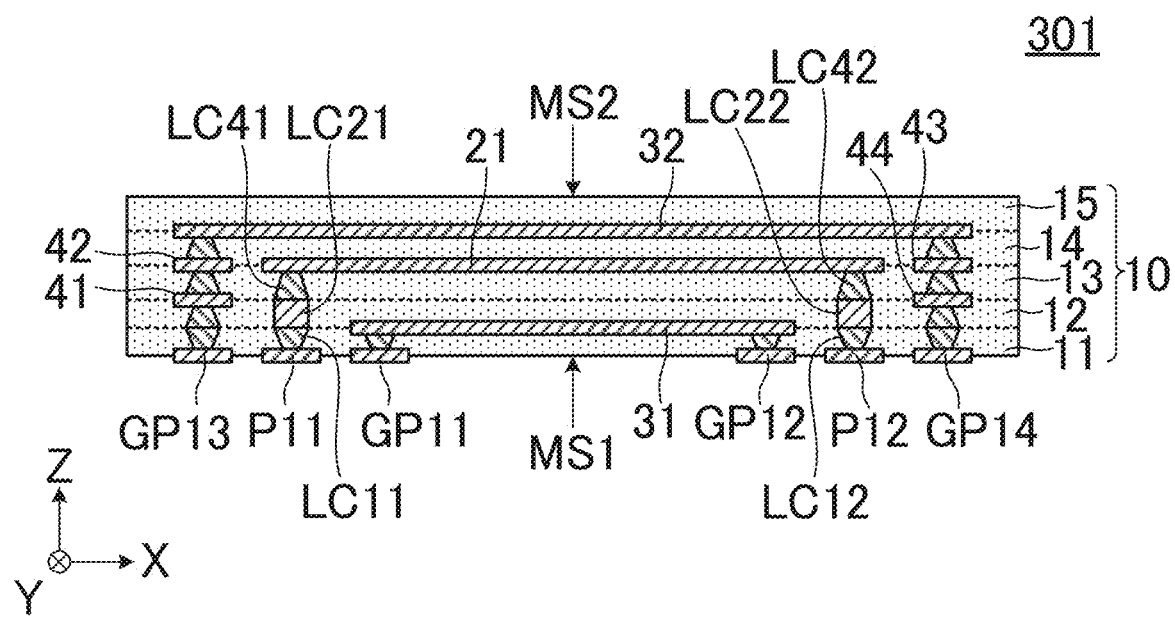
FIG. 1 is a cross-sectional view of a multilayer substrate 301 according to a first preferred embodiment of the present invention.

Hereinafter, preferred embodiments of the present invention will be described in detail with reference to the attached drawings and several specific examples. In the drawings, components and elements assigned with the same reference numerals or symbols will represent the same or substantially the same components and elements. While preferred embodiments of the present invention are divided and described for the sake of convenience in consideration of ease of description or understanding of main points, elements described in different preferred embodiments are able to be partially replaced and combined with each other. In the second and subsequent preferred embodiments, a description of matters common to the first preferred embodiment will be omitted and only different points will be described. In particular, the same or substantially the same advantageous functions and effects by the same or similar configurations will not be described one by one for each preferred embodiment.

First Preferred Embodiment

FIG. 1 is a cross-sectional view of a multilayer substrate 301 according to a first preferred embodiment of the present invention.

The multilayer substrate 301 includes a base body 10, external electrodes P11, P12, GP11, GP12, GP13, and GP14, first interlayer connection conductors LC11 and LC12, second interlayer connection conductors LC21 and LC22, fourth interlayer connection conductors LC41 and LC42, and conductors 21, 31, 32, 41, 42, 43, and 44.

The base body 10 is an elongated insulating flat plate of which the long side direction coincides with an X axis direction, and a plurality of insulating base material layers 11, 12, 13, 14, and 15 are stacked, and heated and pressed. The base body 10 includes a first main surface MS1 and a second main surface MS2 that face each other. The first main surface MS1 and the second main surface MS2 are perpendicular or substantially perpendicular to a stacking direction (a Z axis direction) in which the plurality of insulating base material layers 11 to 15 are stacked on one another. The base body 10 is preferably a flat plate made of a liquid crystal polymer (LCP) or a polyether ether ketone (PEEK), for example, as a main material. It is to be noted that a protective layer such as a solder resist film or a cover lay film may be provided on the first main surface MS1 or the second main surface MS2 of the base body 10.

The external electrodes P11, P12, GP11, GP12, GP13, and GP14 are conductor patterns preferably made of a metal foil such as a Cu foil, for example, provided on the first main surface MS1. It is to be noted that, for example, an Au plating process may be performed with Ni as a base, for example, on the external electrodes P11, P12, GP11, GP12, GP13, and GP14. In addition, the surfaces of the external electrodes P11, P12, GP11, GP12, GP13, and GP14 may be precoated with solder, for example.

In the first preferred embodiment, the external electrodes P11 and P12 correspond to the "first external electrode".

The first interlayer connection conductors LC11 and LC12 are via conductors provided only in the insulating base material layer 11 on which the first external electrodes (the external electrodes P11 and P12) are provided. The first interlayer connection conductor LC11 is connected to the first external electrode (the external electrode P11), and the first interlayer connection conductor LC12 is connected to the first external electrode (the external electrode P12). The first interlayer connection conductors LC11 and LC12 are via conductors provided, for example, by forming a through hole in the insulating base material layer 11, filling the through hole with conductive paste including metal powder including Cu and Sn or an alloy including Cu and Sn, and then solidifying the conductive paste through a heating and pressing process. It is to be noted that the first interlayer connection conductors LC11 and LC12 may be solder, for example.

The "first interlayer connection conductor" is a via conductor to connect a first external electrode and a second interlayer connection conductor (that will be described in detail later). While each of the first interlayer connection conductors LC11 and LC12 according to the first preferred embodiment is one via conductor provided only in the insulating base material layer 11 on which the first external electrode is provided, the present invention is not limited to such a configuration. The first interlayer connection conductor may be configured, for example, such that a plurality of via conductors respectively provided in the plurality of insulating base material layers 11 and 12 including the insulating base material layer 11 may be connected to each other.

The second interlayer connection conductors LC21 and LC22 are metal elements that are disposed in the base body 10 and have higher conductivity than the first interlayer connection conductors LC11 and LC12. The second interlayer connection conductor LC21 is connected to the first external electrode (the external electrode P11) through the first interlayer connection conductor LC11. The second interlayer connection conductor LC22 is connected to the first external electrode (the external electrode P12) through the first interlayer connection conductor LC12. Each of the second interlayer connection conductors LC21 and LC22, for example, is a Cu-made pin having a diameter of about 0.1 mm to about 0.2 mm, or a Cu-made wire that is cut in a predetermined length.

The conductivity of the first interlayer connection conductor and the conductivity of the second interlayer connection conductor are able to be calculated by simulation. For example, a structure including a first interlayer connection conductor, a second interlayer connection conductor, and an electrode provided on both ends of the first and second interlayer connection conductors, and a structure including only a first interlayer connection conductor or only a second interlayer connection conductor, and an electrode provided on both ends of the first interlayer connection conductor or the second interlayer connection conductor are prepared. Subsequently, calculation is performed by applying a probe to the electrodes of the structures, measuring by a multimeter, and simulating measurement results.

The fourth interlayer connection conductors LC41 and LC42 are via conductors to connect the first external electrodes (the external electrodes P11 and P12). The fourth interlayer connection conductor LC41 is connected to the second interlayer connection conductor LC21, and the fourth interlayer connection conductor LC42 is connected to the second interlayer connection conductor LC22. The fourth interlayer connection conductors LC41 and LC42 are via conductors provided, for example, by forming a through hole in the insulating base material layer 13, filling the through hole with conductive paste including metal powder including Cu and Sn or an alloy including Cu and Sn, and then solidifying the conductive paste through a heating and pressing process. It is to be noted that the fourth interlayer connection conductors LC41 and LC42 may be solder, for example.

The "fourth interlayer connection conductor" refers to a via conductor to connect the second interlayer connection conductor and another conductor (a conductor pattern other than an external electrode) or to connect the second interlayer connection conductors. While each of the fourth interlayer connection conductors LC41 and LC42 according to the first preferred embodiment is one via conductor provided only in the insulating base material layer 13, the present invention is not limited to such a configuration. The fourth interlayer connection conductor may be configured, for example, such that a plurality of via conductors respectively provided in the plurality of insulating base material layers may be connected to each other.

As shown in FIG. 1, the connected first interlayer connection conductors (LC11 and LC12), second interlayer connection conductors (LC21 and LC22), and fourth interlayer connection conductors (LC41 and LC42) are disposed in the base body 10 so as to penetrate through one or more of the plurality of insulating base material layers (the insulating base material layers 11, 12, and 13).

The conductor patterns 21, 31, 32, 41, 42, 43, and 44 are conductor patterns provided in the base body 10. The conductors 21, 31, 32, 41, 42, 43, and 44 are conductor patterns such as Cu foil, for example.

As shown in FIG. 1, the external electrode P11 is connected to the external electrode P12. Specifically, the external electrode P11 is connected to one end of the conductor 21 through the first interlayer connection conductor LC11, the second interlayer connection conductor LC21, and the fourth interlayer connection conductor LC41. The other end of the conductor 21 is connected to the external electrode P12 through the first interlayer connection conductor LC12, the second interlayer connection conductor LC22, and the fourth interlayer connection conductor LC42.

In addition, the external electrode GP11 is connected to the external electrode GP12. Specifically, the external electrode GP11 is connected to one end of the conductor 31 through an interlayer connection conductor, and the other end of the conductor 31 is connected to the external electrode GP12 through an interlayer connection conductor. The external electrode GP13 is connected to the external electrode GP14. Specifically, the external electrode GP13 is connected to one end of the conductor 32 through the conductors 41 and 42 and a plurality of interlayer connection conductors. The other end of the conductor 32 is connected to the external electrode GP14 through the conductors 43 and 44 and a plurality of interlayer connection conductors. It is to be noted that the interlayer connection conductors are via conductors provided, for example, by forming a through hole in an insulating base material layer, filling the through hole with conductive paste, and then solidifying the conductive paste through a heating and pressing process. In addition, the interlayer connection conductors may be solder, for example.

In the first preferred embodiment, as shown in FIG. 1, the conductor 21, the conductors (ground conductors) 31 and 32, the insulating base material layers 12 and 13 interposed between the conductor 21 and the conductor 31, and the insulating base material layer 14 interposed between the conductor 21 and the conductor 32 define a high-frequency transmission line having a stripline structure.

It is to be noted that, in the first preferred embodiment, the electrically connected external electrodes P11 and P12, the first interlayer connection conductors LC11 and LC12, the second interlayer connection conductors LC21 and LC22, the fourth interlayer connection conductors LC41 and LC42, and the conductor 21 correspond to the "signal line".

Figure 2:
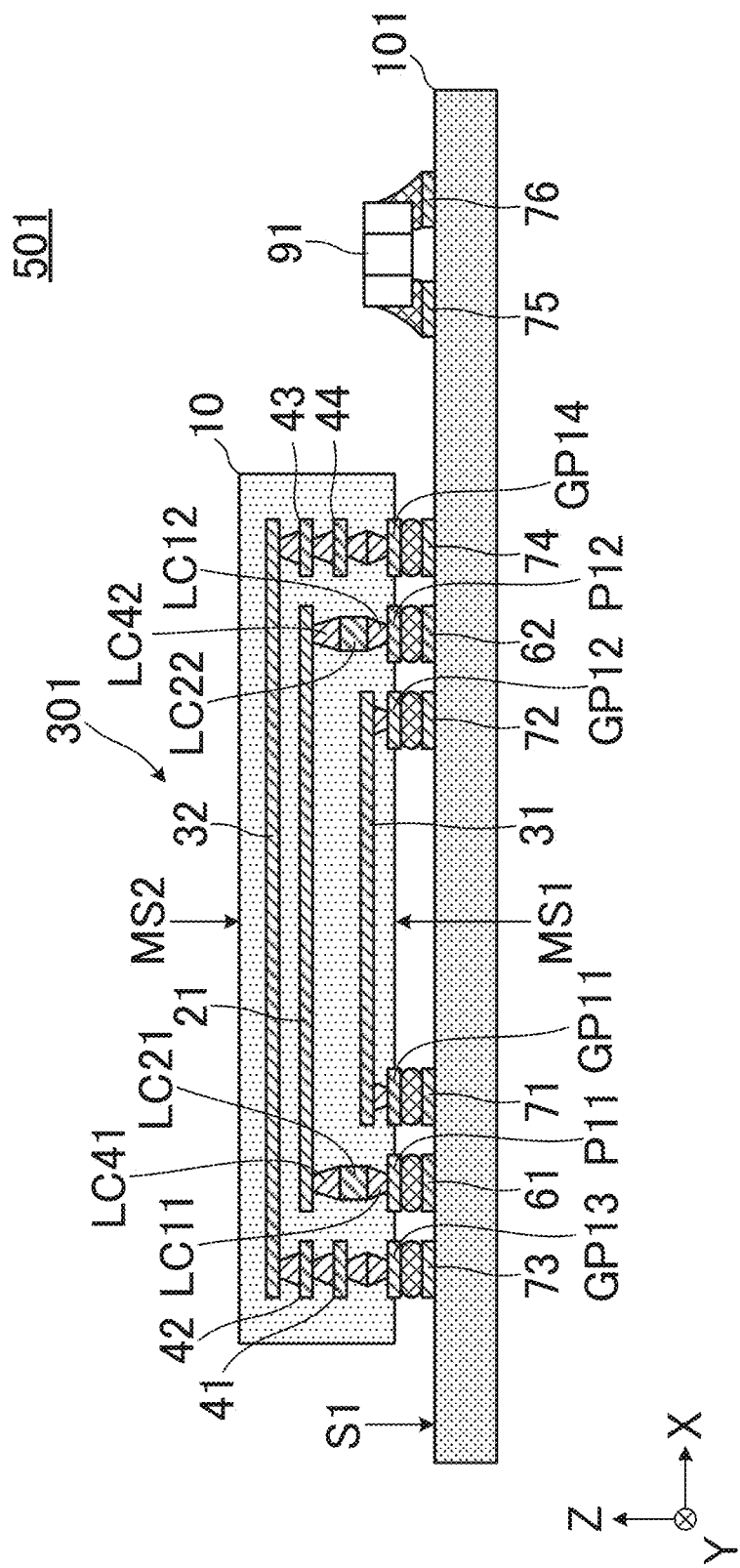
FIG. 2 is a cross-sectional view showing a main portion of an electronic device 501 according to the first preferred embodiment of the present invention.

Subsequently, an electronic device including the multilayer substrate 301 according to the first preferred embodiment of the present invention will be described with reference to the drawings. FIG. 2 is a cross-sectional view showing a main portion of an electronic device 501 according to the first preferred embodiment of the present invention.

The electronic device 501 includes a multilayer substrate 301, a circuit board 101, and a component 91. The circuit board 101 is preferably a glass epoxy substrate, for example.

As shown in FIG. 2, the multilayer substrate 301 and the component 91 are mounted on an upper surface S1 of the circuit board 101. The first main surface MS1 of the base body 10 faces the upper surface S1 of the circuit board 101. The component 91 is a chip component, such as a chip inductor or a chip capacitor, for example.

A plurality of lands 61, 62, 71, 72, 73, 74, 75, and 76 are mounted on the upper surface S1 of the circuit board 101. The lands 71 to 74 are connected to a ground of the circuit board 101.

The external electrodes (the first external electrodes) P11 and P12 are respectively directly soldered to the lands 61 and 62. The external electrodes GP11, GP12, GP13, and GP14 are respectively directly soldered to the lands 71, 72, 73, and 74 and are electrically connected to the ground of the circuit board 101. As a result, the multilayer substrate 301 is electrically connected to the circuit board 101. In addition, the component 91 is directly soldered to both of the lands 75 and 76.

According to the multilayer substrate 301 of the first preferred embodiment of the present invention, the following advantageous effects are obtained.

(a) As stated above, the via conductors such as the first interlayer connection conductors LC11 and LC12 are provided, for example, by filling conductive paste in a through hole provided in an insulating base material layer, and solidifying the conductive paste by a thermal pressing process. The conductive paste is made of a material (a material capable of providing a solid state diffusion layer, together with a conductor pattern, for example) of which the bondability with a conductor pattern or the like is emphasized, so that the conductivity of a via conductor or the like is not very high in many cases. On the other hand, in the first preferred embodiment, the first interlayer connection conductors (via conductors, for example) LC11 and LC12 and the second interlayer connection conductors (metal elements) LC21 and LC22 are used in combination, and provide wiring extending in the stacking direction (the Z axis direction) of the plurality of insulating base material layers 11 to 15 and connected to the first external electrodes (the external electrodes P11 and P12). Therefore, as compared with a case in which the wiring is provided only by a plurality of via conductors, the conductor loss is able to be reduced.

In addition, in the first preferred embodiment, the second interlayer connection conductors LC21 and LC22 made of metal having higher rigidity than a solid state diffusion layer are used for a portion of the wiring extending in the Z axis direction and connected to the first external electrode, so that the rigidity of the wiring is increased. Accordingly, even when bending stress is applied to the multilayer substrate, a crack is unlikely to occur in the wiring.

(b) In addition, in the first preferred embodiment, the via conductor (the first interlayer connection conductors LC11 and LC12, and the fourth interlayer connection conductors LC41 and LC42) defines and functions as a bonding material using a through hole, so that, when the base body 10 is provided, the positional shift of the first interlayer connection conductors LC11 and LC12 as a bonding material does not easily occur. In addition, when the base body 10 is provided, the positional shift of the fourth interlayer connection conductors LC41 and LC42 as a bonding material does not easily occur. Accordingly, a characteristic change due to the positional shift of the first interlayer connection conductors LC11 and LC12 (or the fourth interlayer connection conductor LC41 and LC42), or a short circuit with the other conductors (the first external electrode, the second interlayer connection conductor, or the conductor 32) is able to be significantly reduced or prevented from occurring.

(c) In the first preferred embodiment, the boundary surfaces of the first external electrodes (the external electrodes P11 and P12), and the first interlayer connection conductors LC11 and LC12 are connected by solid state diffusion bonding. According to this configuration, as compared with a case in which the first interlayer connection conductor to be connected to the first external electrode is provided by the plating method or the like, with a simple manufacturing method, the bonding strength between the first external electrode and the first interlayer connection conductor is able to be increased.

(d) In addition, in the first preferred embodiment, the boundary surfaces of the first interlayer connection conductors LC11 and LC12 and the second interlayer connection conductors LC21 and LC22 are connected by solid state diffusion bonding. According to this configuration, as compared with a case in which the first interlayer connection conductor to be connected to the second interlayer connection conductor is provided by the plating method or the like, with a simple manufacturing method, the bonding strength between the first interlayer connection conductor and the second interlayer connection conductor is able to be increased.

(e) In addition, since the via conductors (the first interlayer connection conductors LC11 and LC12) to be connected to the first external electrodes (the external electrodes P11 and P12) are provided by solidifying conductive paste by a thermal pressing process, the external electrodes P11 and P12 are easily flattened during thermal pressing. Therefore, when the multilayer substrate is mounted in the circuit board 101 using solder, a failure in bonding to the circuit board 101 due to irregularities of the surfaces of the external electrodes P11 and P12 is able to be reduced, and bonding strength is able to be increased.

(f) As described above, in the first preferred embodiment, the via conductor (the first interlayer connection conductors LC11 and LC12) and the metal element (the second interlayer connection conductors LC21 and LC22) are used in combination to provide the wiring extending in the Z axis direction. The first interlayer connection conductors (the via conductor) LC11 and LC12 provided by solidifying conductive paste includes a resin component, so that, as compared with the second interlayer connection conductors LC21 and LC22 being a single metal, the bonding strength with the insulating base material layer made of a resin as a main material is high. Therefore, as compared with a case in which wiring extending in the Z axis direction by using only the second interlayer connection conductor is provided, the bonding strength between the wiring extending in the Z axis direction and the insulating base material layer is increased. With this configuration, a multilayer substrate with high mechanical strength and high reliability of electrical connection is able to be achieved.

(g) According to first preferred embodiment, as described above (see the above (a), (c), (d), and the (f)), the bonding strength between the first interlayer connection conductor and the external electrode and between the first interlayer connection conductor and the second interlayer connection conductor are able to be increased, and the rigidity of the wiring extending in the stacking direction (the Z axis direction) and connected to the first external electrode is able to be increased. In particular, as with the electronic device 501 according to the first preferred embodiment, in a case in which the multilayer substrate 301 is directly connected to the circuit board 101 with solder, compared with a case in which a multilayer substrate is connected to a circuit board using a connector, stress due to a difference in the linear expansion coefficient between the multilayer substrate 301 and the circuit board 101 is easily applied to the multilayer substrate 301. On the other hand, according to the first preferred embodiment, even when the stress due to a difference in the linear expansion coefficient between the multilayer substrate 301 and the circuit board 101 is applied, a crack is unlikely to occur in the wiring.

(h) In the first preferred embodiment, the plurality of insulating base material layers 11, 12, 13, 14, and 15 are preferably made of a thermoplastic resin, for example. According to this configuration, as will be described in detail later, since the base body 10 is able to be easily provided by collectively pressing the stacked insulating base material layers 11, 12, 13, 14, and 15, the number of manufacturing steps of the multilayer substrate 301 is reduced, and the cost is able to be reduced.

(i) In addition, in the first preferred embodiment, the second interlayer connection conductors LC21 and LC22 having a higher conductivity than the first interlayer connection conductors (the via conductors) LC11 and LC12 are used for the signal line of a high-frequency transmission line portion. According to this configuration, as compared with a signal line that does not include the second interlayer connection conductors LC21 and LC22, the conductor resistance of the entire signal line is reduced and transmission loss is able to be reduced.

In addition, in a case in which the first interlayer connection conductor and the second interlayer connection conductor are used for the signal line of a high-frequency transmission line, the conductor loss is preferably small in a frequency band used in the second interlayer connection conductor. The conductor loss of the first interlayer connection conductor and the conductor loss of the second interlayer connection conductor are able to be calculated by simulation. For example, a structure including a first interlayer connection conductor, a second interlayer connection conductor, and an electrode provided on both ends of the interlayer connection conductors, and a structure including only a first interlayer connection conductor or a second interlayer connection conductor, and an electrode provided on both ends of the interlayer connection conductor are prepared. Subsequently, calculation is able to be performed by applying a probe to the electrodes of the structures, measuring by a network analyzer, and simulating measurement results.

(j) In the first preferred embodiment, the external electrodes (the first external electrodes) P11 and P12 are respectively directly soldered to the plurality of lands 61 and 62. According to this configuration, as compared with a case in which the multilayer substrate 301 is connected to the circuit board 101 through a connector, impedance mismatching is reduced or prevented and a return loss is also significantly reduced or prevented. In addition, according to this configuration, as compared with the case in which the multilayer substrate 301 is connected to the circuit board 101 through a connector, the multilayer substrate 301 and the circuit board 101 are able to be bonded with almost no unnecessary gap, so that the multilayer substrate 301 is able to be disposed in a small space in the electronic device.

Figure 3:
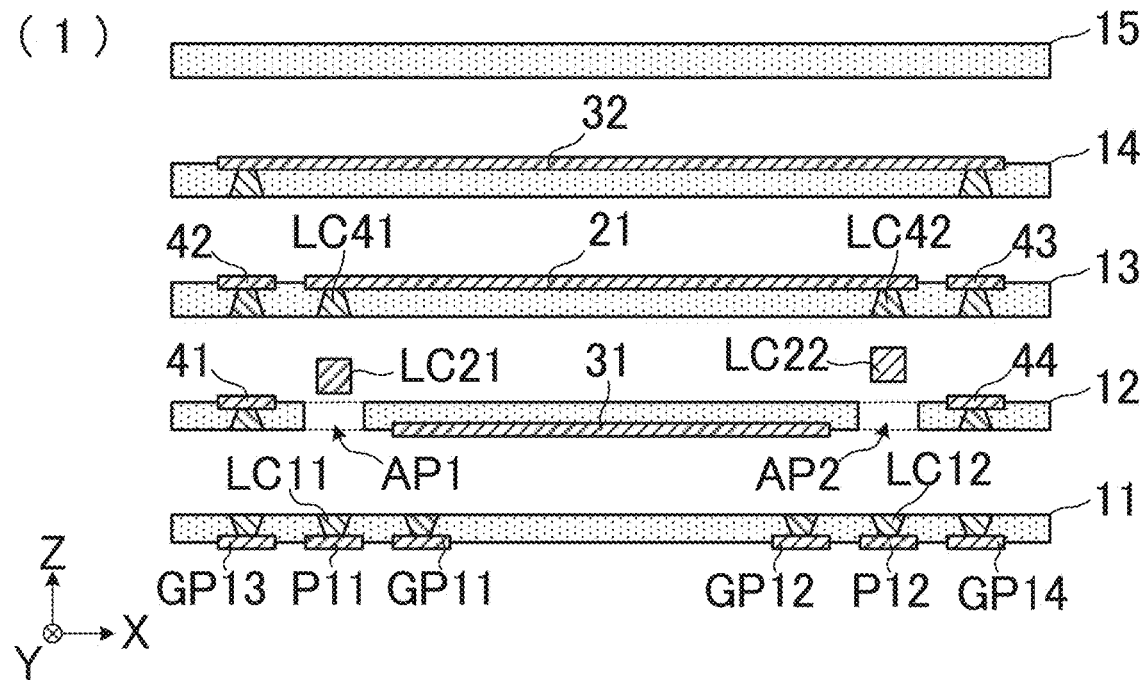
FIG. 3 is a cross-sectional view sequentially showing a process of manufacturing the multilayer substrate 301.
Figure 3:
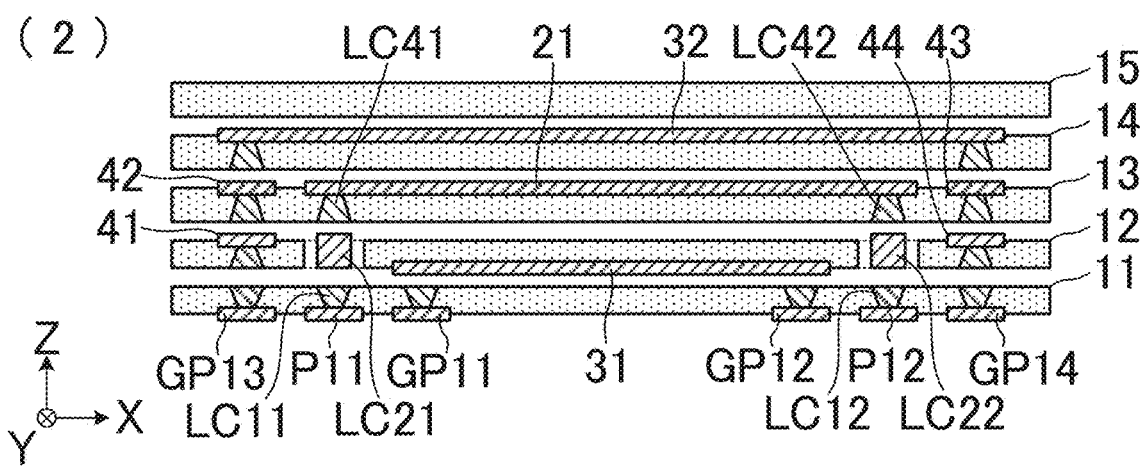
Figure 3:
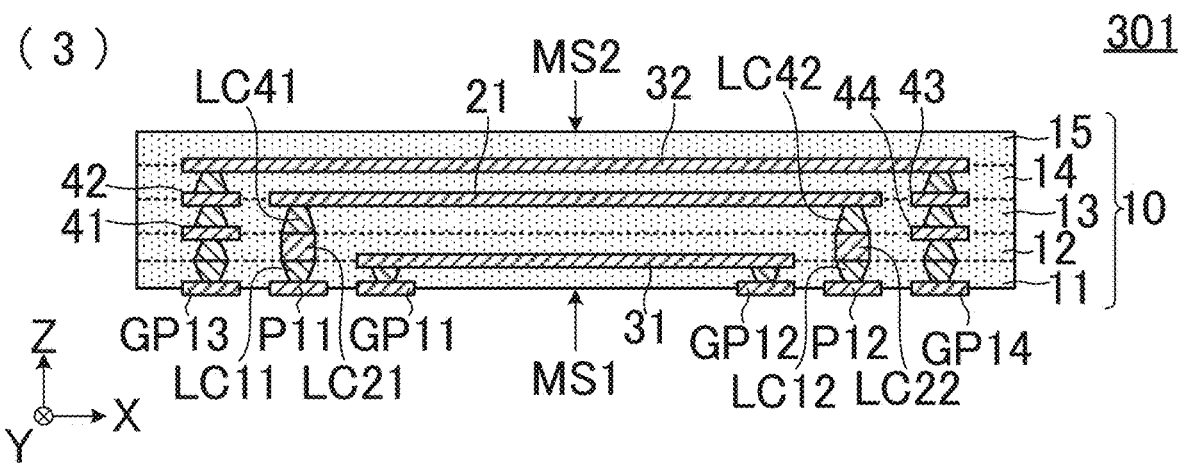

The multilayer substrate 301 according to the first preferred embodiment is manufactured by, for example, the following process. FIG. 3 is a cross-sectional view sequentially showing a process of manufacturing the multilayer substrate 301. It is to be noted that, in FIG. 3, for the sake of convenience of explanation, although explanation will be provided in a manufacturing process for one chip (an individual piece), the actual process of manufacturing a multilayer substrate is performed in the state of a collective substrate.

First, as shown in (1) in FIG. 3, a plurality of insulating base material layers 11, 12, 13, 14, and 15 are prepared. The insulating base material layers 11, 12, 13, 14, and 15 are preferably sheets mainly made of a thermoplastic resin such as a liquid crystal polymer (LCP) or a polyether ether ketone (PEEK), for example.

Subsequently, external electrodes P11, P12, GP11, GP12, GP13, and GP14, conductors 21, 31, 32, 41, 42, 43, 44, and the like are provided on the plurality of insulating base material layers 11, 12, 13, and 14. Specifically, metal foil (Cu foil, for example) is laminated on one side of the insulating base material layers 11, 13, and 14 in a collective substrate state, and then the metal foil is patterned by photolithography, for example. In addition, metal foil (Cu foil, for example) is laminated on both sides of the insulating base material layer 12 in a collective substrate state, and then the metal foil is patterned by photolithography, for example.

Accordingly, the external electrodes P11, P12, GP11, GP12, GP13, and GP14 are provided on the insulating base material layer 11 in a collective substrate state, the conductors 31, 41, and 44 are provided on the insulating base material layer 12 in a collective substrate state, the conductors 21, 42, and 43 are provided on the insulating base material layer 13 in a collective substrate state, and the conductor 32 is provided on the insulating base material layer 14 in a collective substrate state.

In addition, the plurality of insulating base material layers 11, 12, 13, and 14 include first interlayer connection conductors LC11 and LC12, and an interlayer connection conductor. The first interlayer connection conductors LC11 and LC12 and the interlayer connection conductor are provided, for example, by forming a through hole in the insulating base material layers 11, 12, 13, and 14 with a laser or any other suitable method, for example, providing (filling) conductive paste including metal powder including Cu and Sn or an alloy including Cu and Sn, for example, and then solidifying the conductive paste through the subsequent thermal pressing process. Therefore, the first interlayer connection conductor LC11 and LC12 and the interlayer connection conductor are preferably made of a material having a melting point (a melting temperature) lower than the temperature at the time of the subsequent thermal pressing. It is to be noted that the first interlayer connection conductors LC11 and LC12 may be solder, for example.

Further, the insulating base material layer 12 includes openings AP1 and AP2. The openings AP1 and AP2 are through holes having a planar shape corresponding to the planar shape of the second interlayer connection conductors LC21 and LC22. The openings AP1 and AP2 are formed by laser processing or die-cutting such as punching, for example.

Subsequently, as shown in (2) in FIG. 3, the second interlayer connection conductors LC21 and LC22 are prepared. Subsequently, at the same time when the insulating base material layers 11, 12, 13, 14, and 15 are stacked in order, the second interlayer connection conductors LC21 and LC22 are disposed (embedded), respectively, in two hollow portions provided inside the stacked insulating base material layers 11 to 15. More specifically, the openings AP1 and AP2 provide the two hollow portions inside the stacked insulating base material layers 11 to 15. Each of the second interlayer connection conductors LC21 and LC22, for example, is preferably a pin made of Cu and having a diameter of about 0.1 mm to about 0.2 mm, or a wire made of Cu and cut in a predetermined length.

Subsequently, the stacked insulating base material layers 11 to 15 are thermally pressed to provide a base body 10 in a collective substrate state. In the first preferred embodiment, each of the plurality of insulating base material layers 11, 12, 13, 14, and 15 is preferably a sheet made of, for example, a thermoplastic resin as a main material, and the resin flows into the hollow portions during thermal pressing, so that almost no gap remains inside the base body 10 after the thermal pressing. It is to be noted that, in thermal pressing, a smooth surface of a pressing machine is pressed against the external electrodes (the first external electrodes) P11 and P12, so that the surfaces of the first external electrodes P11 and P12 are able to be flattened.

Finally, the collective substrate is separated into individual pieces to obtain the multilayer substrate 301 as shown in (3) in FIG. 3.

According to the above manufacturing method, since the multilayer substrate 301 (the base body 10) is able to be easily provided by collectively pressing the stacked insulating base material layers 11 to 15, the number of manufacturing steps and the cost are able to be reduced.

Second Preferred Embodiment

A second preferred embodiment of the present invention provides an example in which an external electrode is also provided on a second main surface of a base body.

Figure 4:
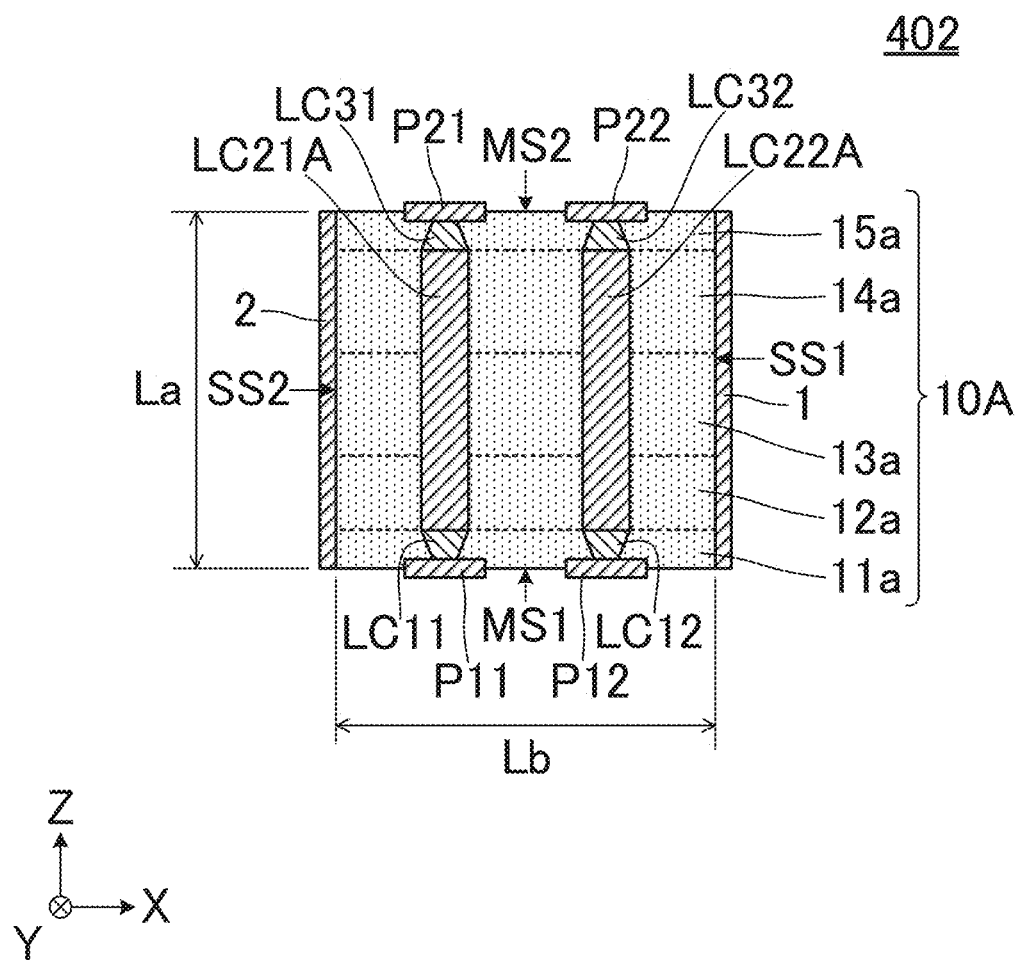
FIG. 4 is a cross-sectional view of an interposer 402 according to a second preferred embodiment of the present invention.

FIG. 4 is a cross-sectional view of an interposer 402 according to the second preferred embodiment of the present invention. It is to be noted that, although the second preferred embodiment describes, as an example, an interposer disposed (interposed) between a first element and a second element and electrically connecting the first element and the second element, another example of the second preferred embodiment may be the multilayer substrate described in the first preferred embodiment.

The interposer 402 includes a base body 10A, external electrodes P11, P12, P21, and P22, planar conductors 1 and 2, first interlayer connection conductors LC11 and LC12, second interlayer connection conductors LC21A and LC22A, and third interlayer connection conductors LC31 and LC32.

Hereinafter, the differences from the multilayer substrate 301 according to the first preferred embodiment will be described.

The base body 10A is an insulator having a rectangular or substantially rectangular parallelepiped shape, and includes a plurality of insulating base material layers 11a, 12a, 13a, 14a, and 15a that are stacked and thermally pressed. The base body 10A includes a first main surface MS1 and a second main surface MS2 that face each other. In addition, the base body 10A includes end surfaces SS1 and SS2 perpendicular or substantially perpendicular to the first main surface MS1 and the second main surface MS2.

The external electrodes P11 and P12 are conductor patterns preferably made of, for example, Cu foil or other suitable material and provided on the first main surface MS1, and the external electrodes P21 and P22 are preferably conductor patterns made of, for example, Cu foil or other suitable material and provided on the second main surface MS2.

In the second preferred embodiment, the external electrodes P11 and P12 correspond to the "first external electrode", and the second external electrodes P21 and P22 correspond to the "second external electrode".

The planar conductor 1 is a conductor film provided on the end surface SS1 of the base body 10A, and the planar conductor 2 is a conductor film provided on the end surface SS2 of the base body 10A. The planar conductors 1 and 2 are preferably plating films such as Cu provided by electroless plating or the like, for example.

The first interlayer connection conductors LC11 and LC12 are via conductors provided only in the insulating base material layer 11a on which the first external electrodes (the external electrodes P11 and P12) are provided. The first interlayer connection conductor LC11 is connected to the external electrode P11, and the first interlayer connection conductor LC12 is connected to the external electrode P12.

The third interlayer connection conductors LC31 and LC32 are via conductors provided only in the insulating base material layer 15a on which the second external electrodes (the external electrodes P21 and P22) are provided. The third interlayer connection conductor LC31 is connected to both of the external electrode P21 and the second interlayer connection conductor LC21A. In addition, the third interlayer connection conductor LC32 is connected to both of the external electrode P22 and the second interlayer connection conductor LC22A. The third interlayer connection conductors LC31 and LC32 are via conductors provided, for example, by forming a through hole in the insulating base material layer 15a, filling the through hole with conductive paste including metal powder including Cu and Sn or an alloy including Cu and Sn, for example, and then solidifying the conductive paste through a thermal pressing process. It is to be noted that the third interlayer connection conductors LC31 and LC32 may be solder, for example.

The "third interlayer connection conductor" is a via conductor to connect a second external electrode and a second interlayer connection conductor. While each of the third interlayer connection conductors LC31 and LC32 according to the second preferred embodiment is one via conductor provided only in the insulating base material layer 15a on which the second external electrode is provided, the present invention is not limited to such a configuration. The third interlayer connection conductor may be configured, for example, such that a plurality of via conductors respectively provided in the plurality of insulating base material layers 15a and 14a including the insulating base material layer 15a may be connected to each other.

The second interlayer connection conductors LC21A and LC22A are metal elements that are disposed in the base body 10A and have higher conductivity than the first interlayer connection conductors LC11 and LC12 and the third interlayer connection conductors LC31 and LC32. The second interlayer connection conductor LC21A is connected to the external electrode P11 through the first interlayer connection conductor LC11, and is connected to the external electrode P21 through the third interlayer connection conductor LC31. The second interlayer connection conductor LC22A is connected to the external electrode P12 through the first interlayer connection conductor LC11, and is connected to the external electrode P22 through the third interlayer connection conductor LC32.

It is to be noted that the second interlayer connection conductors LC21A and LC22A according to the second preferred embodiment have a larger length in the Z axis direction than the second interlayer connection conductors LC21 and LC22 described in the first preferred embodiment.

As shown in FIG. 4, the external electrode P11 is connected to the external electrode P21, and the external electrode P12 is connected to the external electrode P22. Specifically, the external electrode P11 is connected to the external electrode P21 through the first interlayer connection conductor LC11, the second interlayer connection conductor LC21A, and the third interlayer connection conductor LC31. The external electrode P12 is connected to the external electrode P22 through the first interlayer connection conductor LC12, the second interlayer connection conductor LC22A, and the third interlayer connection conductor LC32.

In the second preferred embodiment, the electrically connected external electrodes P11 and P21, the first interlayer connection conductor LC11, the second interlayer connection conductor LC21A, and the third interlayer connection conductor LC31 correspond to the "signal line". In addition, the electrically connected external electrodes P12 and P22, the first interlayer connection conductor LC12, the second interlayer connection conductor LC22A, and the third interlayer connection conductor LC32 correspond to the "signal line".

It is to be noted that, in the second preferred embodiment, as shown in FIG. 4, the wiring between the first external electrodes (the external electrodes P11 and P12) and the second external electrodes (the external electrodes P21 and P22) is provided only by the first interlayer connection conductors (LC11 and LC12), the second interlayer connection conductors (LC21A and LC22A), and the third interlayer connection conductors (LC31 and LC32). In other words, the "signal line" according to the second preferred embodiment does not include any via conductor (the fourth interlayer connection conductor, for example) other than the first interlayer connection conductor and the third interlayer connection conductor.

As shown in FIG. 4, in the second preferred embodiment, the second interlayer connection conductors LC21A and LC22A are disposed in the plurality of insulating base material layers 12a, 13a, and 14a. In addition, a length La of the base body 10A in the stacking direction (the Z axis direction) is larger than a length Lb in a direction (the X axis direction or the Y axis direction) perpendicular or substantially perpendicular to the stacking direction (La>Lb). In addition, in the second preferred embodiment, a length of the second interlayer connection conductors LC21A and LC22A in the stacking direction (the Z axis direction) is larger than a length of the via conductor (the first interlayer connection conductor and the third interlayer connection conductor) in the Z axis direction.

Figure 5:
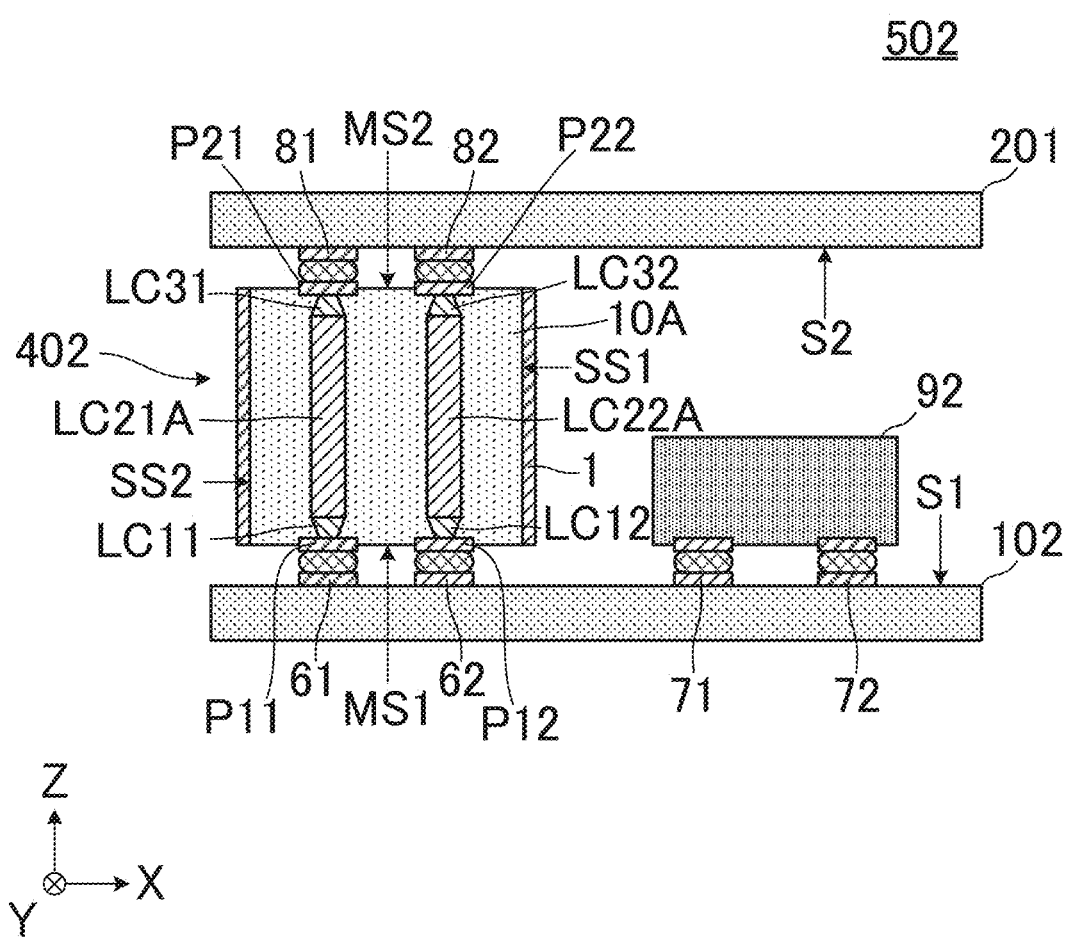
FIG. 5 is a cross-sectional view showing a main portion of an electronic device 502 according to the second preferred embodiment of the present invention.

Subsequently, an electronic device including the interposer 402 according to the second preferred embodiment of the present invention will be described with reference to the drawings. FIG. 5 is a cross-sectional view showing a main portion of an electronic device 502 according to the second preferred embodiment of the present invention.

The electronic device 502 includes an interposer 402, circuit boards 102 and 201, and a component 92. The interposer 402 and the component 92 are entirely disposed (interposed) between the circuit board 102 and the circuit board 201. The circuit boards 102 and 201 are preferably glass epoxy substrates, for example. The component 92 is a chip component such as a chip inductor or a chip capacitor, an RFIC element, or an impedance matching circuit, for example.

In the second preferred embodiment, the circuit board 102 corresponds to the "first element", and the circuit board 201 corresponds to the "second element".

As shown in FIG. 5, the interposer 402 and the component 92 are mounted on an upper surface S1 of the circuit board 102. The first main surface MS1 of the base body 10A faces the upper surface S1 of the circuit board 102, and the second main surface MS2 of the base body 10A faces a lower surface S2 of the circuit board 201.

A plurality of lands 61, 62, 71, and 72 are mounted on the upper surface S1 of the circuit board 102. The external electrodes (the first external electrodes) P11 and P12 are respectively directly soldered to the lands 61 and 62. As a result, the interposer 402 is electrically connected to the circuit board 102. In addition, terminals of the component 92 are respectively directly soldered to the lands 71 and 72.

In addition, a plurality of lands 81 and 82 are mounted on the lower surface S2 of the circuit board 201. The external electrodes (the second external electrodes) P21 and P22 are directly soldered to the lands 81 and 82, respectively. As a result, the interposer 402 is electrically connected to the circuit board 201.

As shown in FIG. 5, in the electronic device 502, the planar conductor 1 is positioned between the signal line (the second interlayer connection conductors LC21A and LC22A, for example) and the component 92.

According to the interposer 402 and the electronic device 502 of the second preferred embodiment of the present invention, the following advantageous effects in addition to the advantageous effects described in the first preferred embodiment are obtained.

(k) In the second preferred embodiment, the interposer 402 is interposed between the first element (the circuit board 102) and the second element (the circuit board 201), and the first element and the second element are electrically connected to each other through the interposer 402. According to this configuration, while a space to mount the component 92 on the surface (the upper surface S1 of the circuit board 102) of the first element or the surface (the lower surface S2 of the circuit board 201) of the second element is ensured, the first element and the second element are able to be electrically connected at a distance from each other.

(l) As described above, the via conductor or the like obtained by solidifying conductive paste does not have very high conductivity in many cases. On the other hand, in the second preferred embodiment, the third interlayer connection conductors (via conductors) LC31 and LC32 and the second interlayer connection conductors (metal elements) LC21 and LC22 are used in combination, and provide wiring extending in the stacking direction (the Z axis direction) of the plurality of insulating base material layers 11a to 15a and connected to the second external electrodes (the external electrodes P21 and P22). Therefore, as compared with a case in which the wiring is provided only by a plurality of via conductors, the conductor loss is able to be reduced.

(m) In the second preferred embodiment, the boundary surfaces of the second external electrodes (the external electrodes P21 and P22), and the third interlayer connection conductors LC31 and LC32 are connected by solid state diffusion bonding. According to this configuration, as compared with a case in which the third interlayer connection conductor to be connected to the second external electrode is provided by the plating method or the like, with a simple manufacturing method, the bonding strength between the third interlayer connection conductor and the second external electrode is able to be increased.

(n) In addition, in the second preferred embodiment, the boundary surfaces of the third interlayer connection conductors LC31 and LC32 and the second interlayer connection conductors LC21 and LC22 are connected by solid state diffusion bonding. According to this configuration, as compared with a case in which the third interlayer connection conductor to be connected to the second interlayer connection conductor is provided by the plating method or the like, with a simple manufacturing method, the bonding strength between the second interlayer connection conductor and the third interlayer connection conductor is able to be increased.

(o) As described above, since the third interlayer connection conductors (the via conductors) LC31 and LC32 to be connected to the second external electrodes (the external electrodes P21 and P22) are provided by solidifying conductive paste by a thermal pressing process, the external electrodes P21 and P22 are easily flattened during thermal pressing. In particular, although it is necessary to position the interposer with high accuracy with respect to the distance between the first element and the second element, it is difficult to position an interposer with high accuracy in a case in which the surface of the external electrode includes irregularities. However, according to the configuration, as with the surface of the first external electrode, the surface of the second external electrode is able to be easily flattened, so that it is possible to position the interposer with high accuracy and to reduce bonding failure due to the irregularities on the surface of the external electrode.

(p) In addition, in a case in which a base body includes the large number of stacked insulating base material layers, and all of the wiring extending in the stacking direction (the Z axis direction) and connected to the external electrode (the first external electrode or the second external electrode) is provided by the via conductor, the number of via conductors that are required is increased and the number of connection points of the via conductors is increased, so that the reliability of electrical connection is reduced. On the other hand, in the second preferred embodiment, the second interlayer connection conductors LC21A and LC22A are disposed in the plurality of insulating base material layers 12a, 13a, and 14a. According to this configuration, the number of via conductors required to provide the wiring is able to be reduced, so that a process of manufacturing the interposer 402 is able to be simplified. In addition, according to this configuration, the reliability of electrical connection of the wiring is increased.

It is to be noted that, in the second preferred embodiment, a wire preferably made of Cu, for example, is cut to provide the second interlayer connection conductor, so that a second interlayer connection conductor having a long (an elongated) shape in the Z axis direction is able to be easily obtained.

(q) In the second preferred embodiment, as shown in FIG. 4, the first interlayer connection conductors LC11 and LC12 are provided only in the insulating base material layer 11a including the first external electrodes (the external electrodes P11 and P12). According to this configuration, as compared with a case in which the first interlayer connection conductor is configured such that a plurality of via conductors are connected to each other, the conductor loss of the wiring extending in the stacking direction (the Z axis direction) and connected to the first external electrode is able to be reduced, and the reliability of electrical connection of the wiring is able to be increased.

It is to be noted that the first interlayer connection conductor is not limited to one via conductor provided in one insulating base material layer (an insulating base material layer including the first external electrode), and a plurality of via conductors may be connected to each other. More specifically, the first interlayer connection conductor may be configured, for example, such that a plurality of via conductors respectively provided in a plurality of insulating base material layers (the plurality of insulating base material layers 11a and 12a shown in FIG. 4, for example) may be connected to each other. However, in order to achieve the above advantageous functions and effects of reducing the conductor loss, it is preferable that the first interlayer connection conductor is provided only in the insulating base material layer including the first external electrode.

(r) In the second preferred embodiment, as shown in FIG. 4, the third interlayer connection conductors LC31 and LC32 are provided only in the insulating base material layer 15a including the second external electrodes (the external electrodes P21 and P22). According to this configuration, as compared with a case in which the third interlayer connection conductor is configured such that a plurality of via conductors are connected to each other, the conductor loss of the wiring extending in the stacking direction (the Z axis direction) and connected to the second external electrode is able to be reduced, and the reliability of electrical connection of the wiring is able to be increased.

It is to be noted that the third interlayer connection conductor is not limited to one via conductor provided in one insulating base material layer (an insulating base material layer including the second external electrode), and a plurality of via conductors may be connected to each other. More specifically, the third interlayer connection conductor may be configured, for example, such that a plurality of via conductors respectively provided in a plurality of insulating base material layers (the plurality of insulating base material layers 15a and 14a shown in FIG. 4, for example) may be connected to each other. However, in order to achieve the above advantageous functions and effects of reducing the conductor loss, it is preferable that the third interlayer connection conductor is provided only in the insulating base material layer including the second external electrode.

(s) A length La of the base body 10A according to the second preferred embodiment in the stacking direction (the Z axis direction) is larger than a length Lb in a direction (the X axis direction or the Y axis direction) perpendicular or substantially perpendicular to the stacking direction (La>Lb). In a case in which the length of the base body in the stacking direction (the Z axis direction) is large and the wiring extending in the stacking direction (the Z axis direction) and connected to an external electrode is long, when the wiring is provided only by a plurality of via conductors, the conductor loss of the wiring is increased. Therefore, in particular, in the case in which the length of the base body in the Z axis direction is large and the wiring is long, the reduction of the conductor loss by using the first interlayer connection conductor and the second interlayer connection conductor in combination is increased.

(t) Further, in the second preferred embodiment, a length of the second interlayer connection conductors LC21A and LC22A in the stacking direction (the Z axis direction) is larger than a length of an interlayer connection conductor (a via conductor such as the first interlayer connection conductor and the third interlayer connection conductor, for example) in the Z axis direction, the interlayer connection conductor electrically connecting to the second interlayer connection conductors LC21A and LC22A. According to this configuration, as compared with a case in which the length of the second interlayer connection conductors LC21A and LC22A in the stacking direction is shorter than the length of the interlayer connection conductor (the via conductor such as the first interlayer connection conductor and the third interlayer connection conductor, for example) in the Z axis direction, the conductor loss is able to be reduced.

(u) In addition, in the second preferred embodiment, as shown in FIG. 4, the wiring (the wiring between the external electrode P11 and the external electrode P21, or the wiring between the external electrode P12 and the external electrode P22) between the first external electrode and the second external electrode is provided only by the first interlayer connection conductor, the second interlayer connection conductor, and the third interlayer connection conductor. According to this configuration, the wiring between the first external electrode and the second external electrode does not include any other via conductors (the fourth interlayer connection conductor, for example) other than the first interlayer connection conductor and the third interlayer connection conductor, so that, as compared with a case in which the wiring includes other via conductors, the conductor loss is able to be further reduced.

(v) The interposer 402 according to the second preferred embodiment includes planar conductors 1 and 2 provided on end surfaces SS1 and SS2 of the base body 10A. In addition, in the second preferred embodiment, the planar conductor 1 is positioned between the signal line (such as the second interlayer connection conductors LC21A and LC22A) and the component 92. According to this configuration, due to a shielding effect of the planar conductor, unnecessary radiation from a signal line to outside (to the component 92) is able to be significantly reduced or prevented, and/or the effect of noise from the outside (the component 92) on the signal line is able to be significantly reduced or prevented. It is to be noted that the planar conductors 1 and 2 described in the second preferred embodiment may be connected to a ground of the circuit board 102 or the circuit board 201.

In addition, according to this configuration, as compared with the configuration in which an interlayer connection conductor is disposed between the signal lines (such as the second interlayer connection conductors LC21A and LC22A) and the end surfaces SS1 and SS2, isolation between the signal line and the outside (the component 92) is able to be increased.

Figure 6:
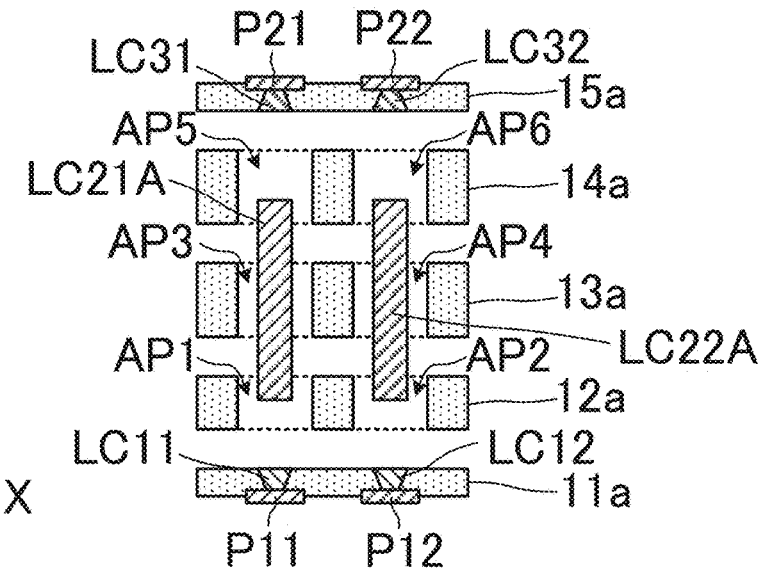
FIG. 6 is a cross-sectional view sequentially showing a process of manufacturing the interposer 402.
Figure 6:
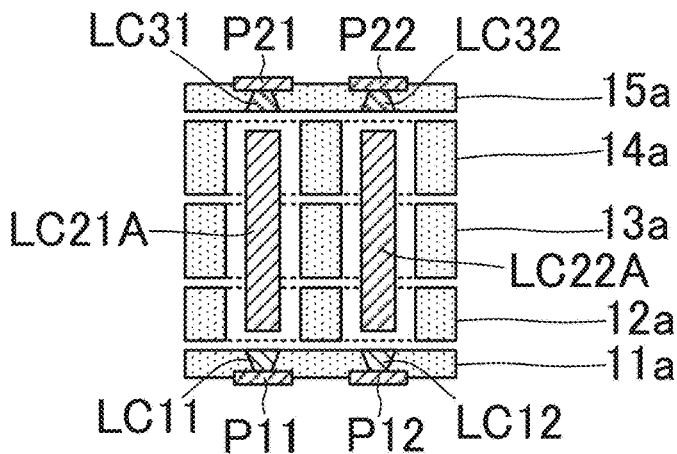
Figure 6:
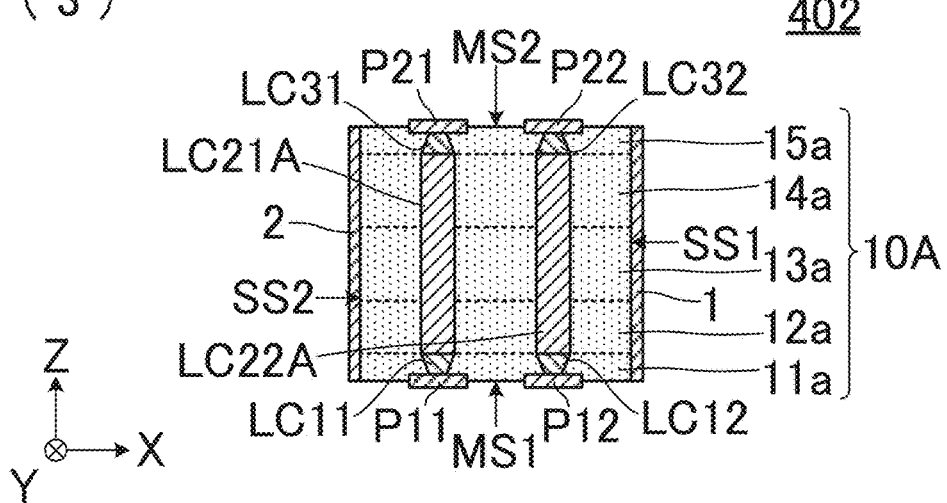

The interposer 402 according to the second preferred embodiment is manufactured by, for example, the following process. FIG. 6 is a cross-sectional view sequentially showing a process of manufacturing the interposer 402. It is to be noted that, in FIG. 6, for the sake of convenience of explanation, although explanation will be provided in a manufacturing process for one chip (an individual piece), the actual process of manufacturing an interposer is performed in the state of a collective substrate.

First, as shown in (1) in FIG. 6, a plurality of insulating base material layers 11a, 12a, 13a, 14a, and 15a are prepared. The configuration of the insulating base material layers 11a, 12a, 13a, 14a, and 15a is the same or substantially the same as the configuration described in the first preferred embodiment.

Subsequently, external electrodes P11, P12, P21, and P22 are provided on the plurality of insulating base material layers 11a and 15a. Specifically, metal foil (Cu foil, for example) is laminated on one side of the insulating base material layers 11a and 15a, and in a collective substrate state, and then the metal foil is patterned by photolithography. As a result, the external electrodes P11 and P12 are provided on the insulating base material layer 11a in a collective substrate state, and the external electrodes P21 and P22 are provided on the insulating base material layer 15a in a collective substrate state.

In addition, the plurality of insulating base material layers 11a and 15a include first interlayer connection conductors LC11 and LC12, and third interlayer connection conductors LC31 and LC32. The first interlayer connection conductors LC11 and LC12 and the third interlayer connection conductors LC31 and LC32 are provided, for example, by forming a through hole in the insulating base material layers 11a, and 15a with a laser or any other suitable method, providing (filling) conductive paste including metal powder including Cu and Sn or an alloy including Cu and Sn, and then solidifying the conductive paste through the subsequent thermal pressing process. Therefore, the first interlayer connection conductor LC11 and LC12 and the third interlayer connection conductors LC31 and LC32 are preferably made of a material having a melting point (a melting temperature) lower than the temperature at the time of the subsequent thermal pressing. It is to be noted that the third interlayer connection conductors LC31 and LC32 may be solder, for example.

Further, the openings AP1 and AP2 are provided in the insulating base material layer 12a, and the openings AP3 and AP4 are provided in the insulating base material layer 13a, and the openings AP5 and AP6 are provided in the insulating base material layer 14a. The openings AP1, AP3, and AP5 are through holes having a planar shape corresponding to the planar shape of the second interlayer connection conductor LC21A. The openings AP2, AP4, and AP6 are through holes having a planar shape corresponding to the planar shape of the second interlayer connection conductor LC22A. The openings AP1, AP2, AP3, AP4, AP5, and AP6 are formed by laser processing or die-cutting such as punching, for example.

Subsequently, as shown in (2) in FIG. 6, the second interlayer connection conductors LC21A and LC22A are prepared. Subsequently, at the same time when the insulating base material layers 11a, 12a, 13a, 14a, and 15a are stacked in order, the second interlayer connection conductors LC21A and LC22A are disposed (embedded), respectively, in two hollow portions provided inside the stacked insulating base material layers 11a to 15a. More specifically, the openings AP1, AP2, AP3, AP4, AP5, and AP6 provide the two hollow portions inside the stacked insulating base material layers 11a to 15a.

Subsequently, the stacked insulating base material layers 11a to 15a are thermally pressed to provide a base body 10A in a collective substrate state, and the collective substrate is divided into individual pieces.

Finally, the planar conductors 1 and 2 are provided on the end surfaces SS1 and SS2 of the base body 10A, respectively, to obtain the interposer 402 shown in (3) in FIG. 6.

The planar conductors 1 and 2 are preferably plating films such as Cu provided by electroless plating or the like, for example.

It is to be noted that, while the second preferred embodiment provides an example of an electronic device in which the component 92 is mounted only on the first element (the circuit board 102), the present invention is not limited to such a configuration. A component may be mounted only on the second element (the circuit board 201), and a component may be mounted on both of the first element and the second element.

While the second preferred embodiment provides an example in which the interposer 402 and the first element (the circuit board 102) are directly connected through solder, the interposer and the first element may be connected through a connector. For example, a plug connected to the first external electrode is provided on the interposer 402, a receptacle is mounted on the upper surface S1 of the first element (the circuit board 102), and the interposer and the first element may be electrically and mechanically connected to each other by fitting of the plug and the receptacle. The same applies to connection between the interposer and the second circuit board.

It is to be noted that, while each of the above described preferred embodiments provides an example in which the base body has an elongated shape or a rectangular or substantially rectangular parallelepiped shape, the shape of the base body is able to be appropriately changed in the scope in which the advantageous functions and effects of preferred embodiments of the present invention are obtained. The plane shape of the base body may be a polygon, a circle, an ellipse, an L shape, a crank shape, a T shape, a Y shape, a ring shape, or the like, for example.

While each of the above described preferred embodiments provides an example of a base body obtained by stacking five insulating base material layers on one another, the number of insulating base material layers of a base body is not limited to five. As long as the number of stacked insulating base material layers of a base body is two or more, the number may be four or less, or may be six or more.

In addition, while each of the above described preferred embodiments provides an example in which a plurality of insulating base material layers of a base body are made of a thermoplastic resin, the present invention is not limited to such a configuration. The plurality of insulating base material layers may be a thermosetting resin. However, in a case in which the plurality of insulating base material layers are made of a thermoplastic resin, the plurality of insulating base material layers are easily provided as described above, so that the number of steps of manufacturing a multilayer substrate and the cost are able to be reduced.

In addition, the shape of the first external electrode and the second external electrode, and the number of first external electrodes and second external electrodes are not limited to the configuration example in each of the above described preferred embodiments, and are able to be appropriately changed within the scope of advantageous functions and effects of preferred embodiments of the present invention.

It is to be noted that a high-frequency transmission line provided on the interposer is not limited to the configuration shown in each of the above described preferred embodiments. The interposer may include other transmission lines (such as a microstrip line and a coplanar line), for example.

In addition, while each of the above described preferred embodiments provides an example of a multilayer substrate (or an interposer) including only a high-frequency transmission line, the present invention is not limited to such a configuration. The circuit configuration provided in the multilayer substrate (or the interposer) is not limited to the configuration described in each of the above described preferred embodiments, and a circuit configuration is able to be appropriately changed within the scope of advantageous functions and effects of the preferred embodiments of the present invention. For example, the multilayer substrate (or the interposer) may include a frequency filter including various filters (a low pass filter, a high pass filter, a band pass filter, and a band elimination filter). Further, the multilayer substrate (or the interposer) may include a coil defined by a conductor pattern, or a capacitor defined by a conductor pattern. In addition, for example, a chip component such as a chip inductor or a chip capacitor may be mounted in contact with the base body. Further the chip component may be embedded inside the base body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a base body including:
        a plurality of insulating base material layers stacked on one another; and
        a first main surface perpendicular or substantially perpendicular to a stacking direction in which the plurality of insulating base material layers are stacked;
    a first external electrode on the first main surface and made of metal foil;
    a first interlayer connection conductor connected to the first external electrode and disposed in the base body so as to penetrate one or more of the plurality of the insulating base material layers;
    a second interlayer connection conductor disposed in the base body so as to penetrate one or more of the plurality of insulating base material layers; and
    a third interlayer connection conductor disposed in the base body so as to penetrate one or more of the plurality of insulating base material layers; wherein
    the second interlayer connection conductor includes a first end and a second end in the stacking direction;
    the first end of the second interlayer connection conductor is directly connected to the first interlayer connection conductor;
    the second end of the second interlayer connection conductor is directly connected to the third interlayer connection conductor; and
    the second interlayer connection conductor has higher conductivity than the first interlayer connection conductor and the third interlayer connection conductor.

2. The multilayer substrate according to claim 1, wherein the first interlayer connection conductor is provided at least in an insulating base material layer on which the first external electrode is provided, among the plurality of insulating base material layers.

3. The multilayer substrate according to claim 2, wherein the first interlayer connection conductor is provided only in an insulating base material layer on which the first external electrode is provided.

4. The multilayer substrate according to claim 1, wherein the base body includes a second main surface that faces the first main surface;
    the multilayer substrate further includes a second external electrode on the second main surface and made of metal foil; and
    the third interlayer connection conductor is provided at least in an insulating base material layer on which the second external electrode is provided, among the plurality of insulating base material layers, and connected to the second external electrode.

5. The multilayer substrate according to claim 4, wherein the third interlayer connection conductor is provided only in the insulating base material layer on which the second external electrode is provided.

6. The multilayer substrate according to claim 1, wherein a length of the base body in the stacking direction is larger than a length of the base body in a direction perpendicular or substantially perpendicular to the stacking direction.

7. The multilayer substrate according to claim 1, wherein
    the base body includes an end surface perpendicular or substantially perpendicular to the first main surface; and
    a planar conductor is provided on the end surface.

8. The multilayer substrate according to claim 1, wherein the second interlayer connection conductor is disposed in two or more insulating base material layers among the plurality of insulating base material layers.

9. The multilayer substrate according to claim 1, wherein a length of the second interlayer connection conductor in the stacking direction is larger than a length of an interlayer connection conductor in the stacking direction, the interlayer connection conductor being electrically connected to the second interlayer connection conductor.

10. The multilayer substrate according to claim 1, further comprising:
    a signal line defining at least a portion of a high-frequency transmission line; wherein
    the signal line includes the first interlayer connection conductor and the second interlayer connection conductor.

11. The multilayer substrate according to claim 1, wherein at least one of the plurality of insulating base material layers includes the first interlayer connection conductor and the second interlayer connection conductor, or the third interlayer connection conductor and the second interlayer connection conductor.

12. An interposer disposed between a first element and a second element and electrically connecting the first element and the second element, the interposer comprising:
    a base body including:
        a plurality of insulating base material layers stacked on one another; and
        a first main surface and a second main surface perpendicular or substantially perpendicular to a stacking direction in which the plurality of insulating base material layers are stacked, the first main surface and the second main surface facing each other;
    a first external electrode on the first main surface and made of metal foil;
    a second external electrode on the second main surface and made of metal foil;
    a first interlayer connection conductor connected to the first external electrode and disposed in the base body so as to penetrate one or more of the plurality of the insulating base material layers;
    a second interlayer connection conductor disposed in the base body so as to penetrate one or more of the plurality of insulating base material layers; and a third interlayer connection conductor connected to the second external electrode and disposed in the base body so as to penetrate one or more of the plurality of insulating base material layers; wherein the second interlayer connection conductor includes a first end and a second end in the stacking direction;

the first end of the second interlayer connection conductor is directly connected to the first interlayer connection conductor;

the second end of the second interlayer connection conductor is directly connected to the third interlayer connection conductor; and the second interlayer connection conductor has higher conductivity than the first interlayer connection conductor and the third interlayer connection conductor.

13. The interposer according to claim 12, wherein the first interlayer connection conductor is provided at least in an insulating base material layer on which the first external electrode is provided, among the plurality of insulating base material layers; and the third interlayer connection conductor is provided at least in an insulating base material layer on which the second external electrode is provided, among the plurality of insulating base material layers.

14. The interposer according to claim 12, wherein wiring between the first external electrode and the second external electrode is provided only by the first interlayer connection conductor, the second interlayer connection conductor, and the third interlayer connection conductor.

15. The interposer according to claim 12, wherein the base body includes an end surface perpendicular or substantially perpendicular to the first main surface; and the interposer further includes a planar conductor on the end surface.

16. The interposer according to claim 12, wherein at least one of the plurality of insulating base material layers includes the first interlayer connection conductor and the second interlayer connection conductor, or the third interlayer connection conductor and the second interlayer connection conductor.

17. An electronic device comprising:

a first element;

a second element; and an interposer disposed between the first element and the second element and electrically connecting the first element and the second element, the interposer comprising:

a base body including:

a plurality of insulating base material layers stacked on one another; and a first main surface and a second main surface perpendicular or substantially perpendicular to a stacking direction in which the plurality of insulating base material layers are stacked, the first main surface and the second main surface facing each other;

a first external electrode provided on the first main surface and made of metal foil;

a second external electrode provided on the second main surface and made of metal foil;

a first interlayer connection conductor connected to the first external electrode and disposed in the base body so as to penetrate one or more of the plurality of insulating base material layers;

a second interlayer connection conductor disposed in the base body so as to penetrate one or more of the plurality of insulating base material layers; and a third interlayer connection conductor connected to the second external electrode and disposed in the base body so as to penetrate one or more of the plurality of insulating base material layers; wherein the second interlayer connection conductor includes a first end and a second end in the stacking direction;

the first end of the second interlayer connection conductor is directly connected to the first interlayer connection conductor;

the second end of the second interlayer connection conductor is directly connected to the third interlayer connection conductor; and the second interlayer connection conductor has higher conductivity than the first interlayer connection conductor and the third interlayer connection conductor.

18. The electronic device according to claim 17, wherein the first interlayer connection conductor is provided at least in an insulating base material layer on which the first external electrode is provided, among the plurality of insulating base material layers; and the third interlayer connection conductor is provided at least in an insulating base material layer on which the second external electrode is provided, among the plurality of insulating base material layers.

19. The electronic device according to claim 17, further comprising a component mounted on the first element or the second element and disposed between the first element and the second element.

20. The electronic device according to claim 19, wherein the base body includes an end surface perpendicular or substantially perpendicular to the first main surface; the interposer includes a planar conductor provided on the end surface; and the planar conductor is positioned between the second interlayer connection conductor and the component.

21. The electronic device according to claim 17, wherein at least one of the plurality of insulating base material layers includes the first interlayer connection conductor and the second interlayer connection conductor, or the third interlayer connection conductor and the second interlayer connection conductor.

* * * * *